(12) United States Patent
Arita

(10) Patent No.: US 7,982,852 B2
(45) Date of Patent: Jul. 19, 2011

(54) EXPOSURE APPARATUS AND DEVICE MANUFACTURING METHOD

(75) Inventor: Keiichi Arita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 521 days.

(21) Appl. No.: 12/118,965

(22) Filed: May 12, 2008

(65) Prior Publication Data

US 2008/0297743 A1 Dec. 4, 2008

(30) Foreign Application Priority Data

May 30, 2007 (JP) ................................. 2007-144279

(51) Int. Cl.
*G03B 27/42* (2006.01)
(52) U.S. Cl. ........................................... 355/53; 355/72
(58) Field of Classification Search .................... 355/53, 355/72
See application file for complete search history.

(56) References Cited

U.S. PATENT DOCUMENTS

| | | | |
|---|---|---|---|
| 5,448,332 A | 9/1995 | Sakakibara | |
| 5,693,439 A | 12/1997 | Tanaka | |
| 6,433,872 B1 | 8/2002 | Tanaka | |
| 6,476,904 B1 * | 11/2002 | Kubo | 355/55 |
| 6,608,681 B2 | 8/2003 | Sakakibara | |
| 2007/0206169 A1* | 9/2007 | Butler | 355/53 |

FOREIGN PATENT DOCUMENTS

JP 6-260391 A 9/1994

* cited by examiner

*Primary Examiner* — Edward J Glick
*Assistant Examiner* — Mesfin T Asfaw
(74) *Attorney, Agent, or Firm* — Canon U.S.A., Inc. IP Division

(57) ABSTRACT

A scanning exposure apparatus exposing a substrate to a pattern of an original through a projection optical system while relatively moving the original and the substrate, includes a substrate stage movable while holding the substrate; a measurement system measuring a position of the substrate in an optical-axis direction of the projection optical system; and a controller relatively moving the original and the substrate while controlling a position of the substrate stage in the optical-axis direction, on the basis of the position of the substrate detected by the measurement system. The controller keeps accelerating the substrate stage up to a starting position of the irradiation of the exposure light for a target shot area on the substrate, and during the acceleration, controls the position of the substrate stage in the optical-axis direction, on the basis of a position of a surface of an exposed shot area, which has been exposed previously.

8 Claims, 4 Drawing Sheets

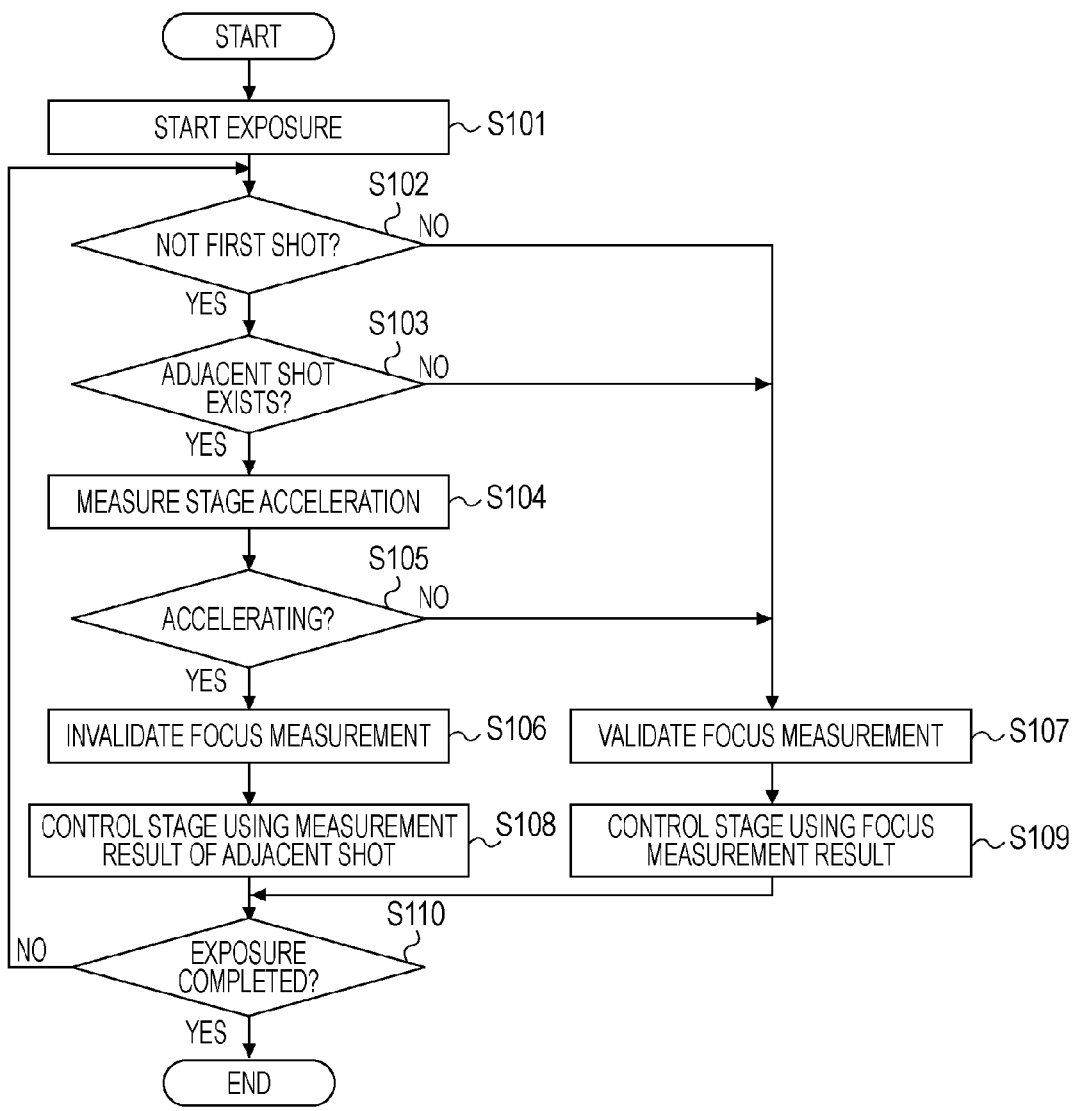

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

In a semiconductor exposure apparatus that exposes a wafer (substrate) to a pattern of a reticle through a projection optical system, it is important to accurately align a surface of the wafer with an image plane of the projection optical system (i.e., focusing) for realizing miniaturization of a circuit pattern, and an increase in yield of production.

For example, Japanese Patent Laid-Open No. 6-260391 suggests a pre-reading focus measurement system, as a unit configured to accurately align a surface of a wafer with an image plane in a scanning exposure apparatus.

The focus measurement system includes a focus sensor that performs a focus measurement for a measurement point at a position apart from an exposure area of a projection optical system by a predetermined distance in a direction opposite to a scanning direction. Also, the focus measurement system measures the surface shape of a wafer by using the focus sensor before the measurement point enters the exposure area.

The focus sensor measures the position of the surface of the wafer in a direction parallel to an optical axis of the projection optical system by using a plurality of measurement points.

The surface of the wafer is aligned with the image plane on the basis of the measurement result, and focusing is performed.

In the above-mentioned focus measurement system suggested by Japanese Patent Laid-Open No. 6-260391, the focus measurement of a shot area on a substrate is started before the shot area reaches the exposure area.

Owing to this, a constant speed section in which a wafer stage is driven at a constant speed has to be provided before the shot area reaches the exposure area.

To reduce a time necessary for the exposure, or to increase the throughput, the constant speed section may be reduced, and the focus measurement may be performed even in an acceleration section in which the wafer stage is accelerated.

However, a deformation or a vibration is possibly generated at the wafer stage in the acceleration section, and hence, the accuracy of the focus measurement may be degraded.

Thus, it is difficult to increase the throughput by reducing a preparatory distance for performing a scanning exposure on the shot area.

In light of the above situations, it would be desirable to provide an exposure device that increases the throughput by reducing the preparatory distance.

SUMMARY OF THE INVENTION

The present invention provides an exposure device and method that desirably increases throughput by reducing a preparatory distance.

According to an aspect of the present invention, an exposure apparatus exposes a substrate to a pattern of an original through a projection optical system while relatively moving the original and the substrate. The apparatus includes a substrate stage movable while holding the substrate; a measurement system configured to measure a position of the substrate in an optical-axis direction of the projection optical system; and a controller configured to relatively move the original and the substrate while controlling a position of the substrate stage in the optical-axis direction, on the basis of the position of the substrate detected by the measurement system. The controller keeps accelerating the substrate stage up to a starting position of the irradiation of the exposure light for a target shot area on the substrate, and in the acceleration section, the controller controls the position of the substrate stage in the optical-axis direction, on the basis of a position of a surface of an exposed shot area, which has been exposed previously.

Further features and aspects of the present invention will become apparent from the following description of exemplary embodiments with reference to the attached drawings.

BRIEF DESCRIPTION OF THE DRAWINGS

FIG. 6 is a flowchart showing focus control and driving of a wafer stage according to a second embodiment of the present invention.

DESCRIPTION OF THE EMBODIMENTS

Various embodiments, features and aspects of the present invention are described below with reference to the attached drawings.

Figure 1:
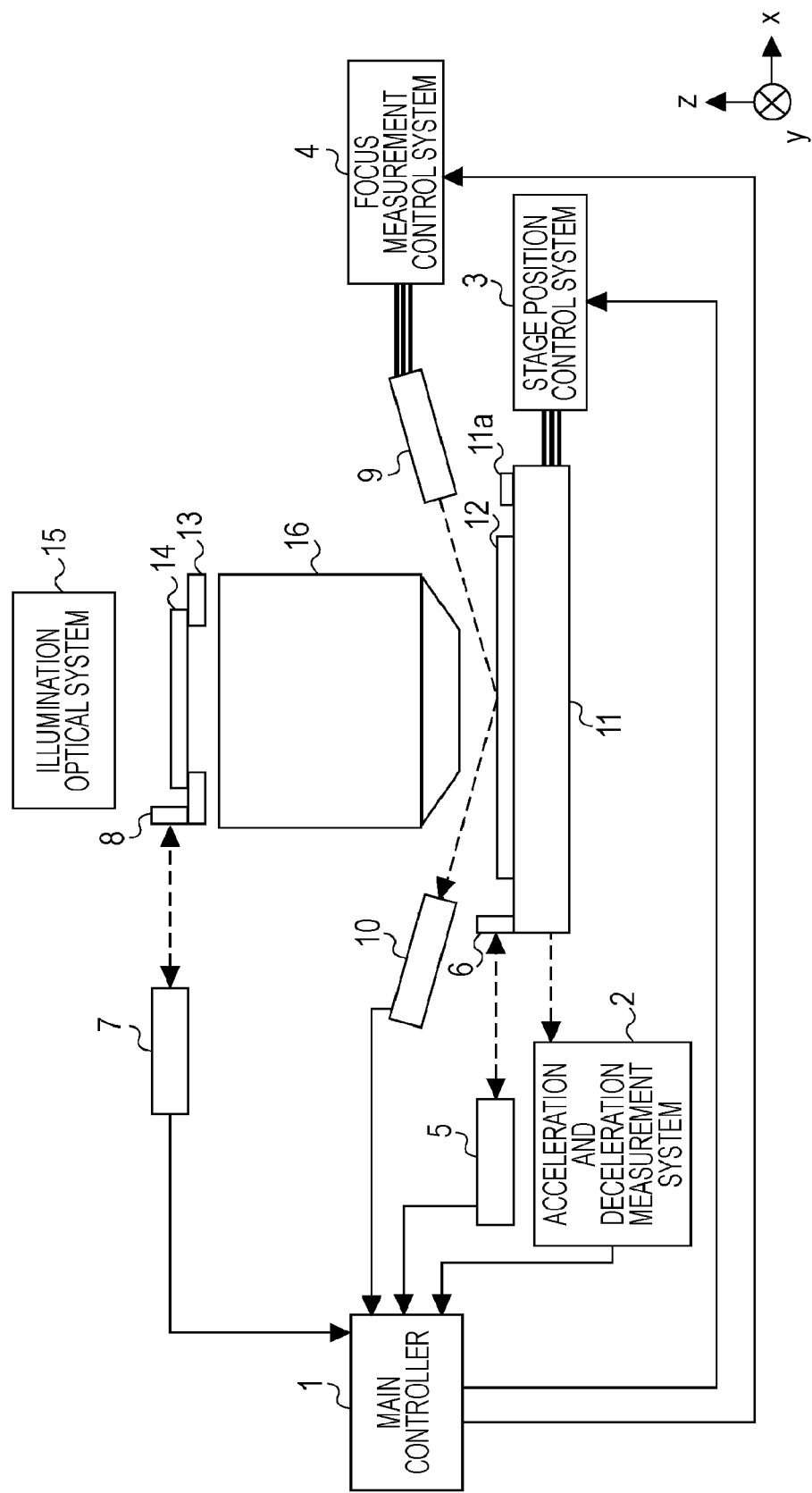
FIG. 1 is an illustration showing an example exposure apparatus according to a first embodiment of the present invention.

FIG. 1 illustrates an exposure apparatus according to a first embodiment. The exposure apparatus exposes a wafer 12 to a pattern of a reticle (original) 14 such that an illumination optical system 15 illuminates the reticle 14 with light and a projection optical system 16 projects light transmitted through the reticle 14 on the wafer 12. The reticle 14 is held by a reticle stage 13. The wafer 12 is held by a wafer stage 11. For convenience of the description, axes of the x, y, and z directions are defined as shown in FIG. 1.

The exposure apparatus according to the first embodiment is a step-and-scan exposure apparatus. An exposure is performed while the reticle 14 and the wafer 12 are oppositely moved in the x direction. The reticle 14 and the wafer 12 are driven through synchronous scanning of the reticle stage 13 and the wafer stage 11. A laser interferometer 7 measures the position of the reticle stage 13. A main controller 1 controls the position of the reticle stage 13. The laser interferometer 7 emits a laser beam on a mirror 8 provided at the reticle stage 13, and measures the position of the reticle stage 13 by using the reflected light. Similarly to the case of the reticle stage 13, the position of the wafer stage 11 is measured by using a laser interferometer 5 and a mirror 6 provided at the wafer stage 11. The main controller 1 controls the position of the wafer stage 11.

Figure 2:
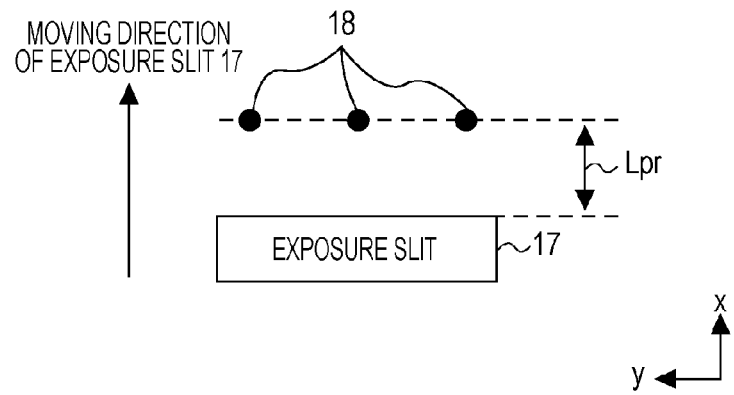
FIG. 2 is an illustration showing an arrangement of an example exposure slit, and measurement points of a focus measurement system.

An area on the wafer 12 illuminated with exposure light through the projection optical system 16 has a slit-like shape, which is called exposure slit 17 (see FIG. 2). The exposure slit 17 has a short side in the x direction, and a long side in the y direction. The position of the exposure slit 17 is fixed. However, as the wafer 12 is moved in the x direction, the exposure slit 17 relatively moves in the x direction in the exposure area on the wafer 12. Since the exposure slit 17 moves (scans) in the x direction in the exposure area on the wafer 12, an exposure is performed. An area of the wafer 12 to be exposed by a single scanning exposure is called shot area. A plurality of shot areas are provided on the wafer 12. After an exposure is performed for a single shot area, the wafer stage 11 is moved by stepping so as to move the exposure slit 17 to a next shot area, and a next scanning exposure is performed. A moving direction of the exposure slit 17 for the next scanning exposure is opposite to the moving direction for the previous scanning exposure. With this configuration, the wafer stage 11 need not be returned every scanning exposure. Hence, the throughput of the exposure apparatus can be increased.

During an exposure, the wafer stage 11 is driven at a constant speed. Before and after the exposure, it is necessary to accelerate or decelerate the wafer 12. The exposure apparatus includes an acceleration and deceleration measurement system 2, which measures an acceleration (and deceleration) of the wafer stage 11.

In addition, to accurately expose the wafer 12 to the pattern of the reticle 14, it is necessary to locate the wafer 12 at a best focus position of the projection optical system 16. Accordingly, the exposure apparatus includes a focus measurement system which measures a focus (position in the z direction) of the surface of the wafer 12. The focus measurement system includes a light emitting portion 9, a light detecting portion 10, and a focus measurement control system 4 that controls the light emitting portion 9 and the light detecting portion 10. The light emitting portion 9 emits light so as to be obliquely incident on the wafer 12, and the light detecting portion 10 detects the reflected light from the wafer 12. Accordingly, the focus of the wafer 12 is measured.

During a scanning exposure, the focus measurement system performs a focus measurement synchronously with driving of the stage for the exposure. Using the measurement result of the focus measurement system, the main controller 1 outputs an instruction to a stage position control system 3 to drive the wafer stage 11 in the z direction so that the wafer 12 is located at the best focus position of the projection optical system 16.

Next, the configuration of the focus measurement system is described in more detail with reference to FIG. 2 in addition to FIG. 1. In the first embodiment, a focus sensor measures the position of the surface of the wafer 12 in the optical-axis direction of the projection optical system 16 by using three measurement points 18 on the wafer 12. As shown in FIG. 2, the measurement points 18 are located apart from the exposure slit 17 by a distance Lpr in the moving direction of the exposure slit 17. During an exposure, a focus measurement is performed at positions of the measurement points 18 on the wafer 12. Using the focus measurement result, the position of the surface of the wafer 12 is aligned with the best focus position of the projection optical system 16 before the exposure slit 17 moves to and reaches an area on the wafer 12 where the measurement points 18 have been located. The focus measurement is continuously performed during the exposure. The wafer stage 11 scans in the x direction, and at the same time, the wafer stage 11 is continuously driven in the z direction to follow the focus measurement result. Although not shown in FIG. 2, measurement points 18 are also located at symmetric positions with respect to the exposure slit 17. Thus, such measurement points 18 can be used for a scanning exposure when the wafer stage 11 is driven in the −x direction.

Figure 3:
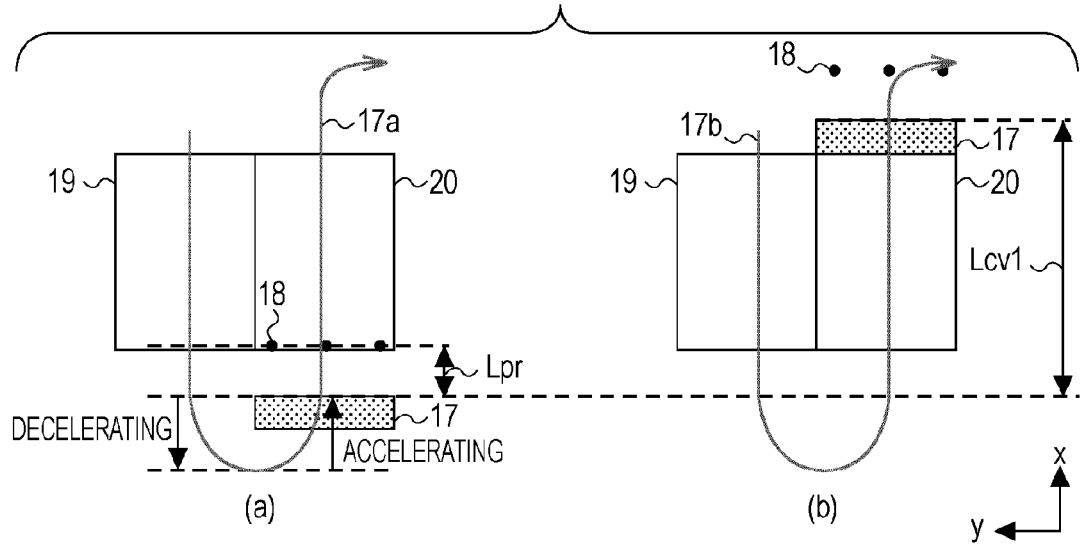
FIG. 3 is an illustration showing a driving locus of a wafer stage during focus control of related art.

Next, prior to describing the first embodiment, a focus measurement and a state of a driving locus of an exposure slit 17 of related art during a scanning exposure are described, as a comparative example, with reference to FIG. 3. FIG. 3 illustrates two shot areas 19 and 20. Driving loci 17a and 17b of the exposure slit 17 are additionally drawn. Part (a) of FIG. 3 shows the start of an exposure on the shot area 20. Part (b) of FIG. 3 shows the end of the exposure. The shot area 19 is a previous shot area in which an exposure has been completed prior to an exposure for the shot area 20. As shown in part (a) of FIG. 3, in the control of the focus measurement and the scanning exposure of related art, acceleration of the wafer stage 11 is ended when the measurement points 18 reaches an end of the shot area 20, and an exposure is performed while the exposure slit 17 is driven at a constant speed. As shown in part (b) of FIG. 3, the driving at the constant speed is performed until when the exposure slit 17 passes the shot area 20. When the exposure slit 17 has passed the shot area 20, the exposure of the shot area 20 is completed. Then, the wafer stage 11 is decelerated and is stopped. In a constant speed section Lcv1, the wafer stage 11 is driven at the constant speed. The feature of the control is that a constant speed movement of the wafer stage 11 is started when the measurement points 18 reach a shot area. As described above, however, a deformation or a vibration is possibly generated at a wafer stage in an acceleration section, and hence, the accuracy of a focus measurement may be degraded. To avoid this, the wafer stage 11 is brought into driving at a constant speed so that the focus measurement can be performed when the measurement points 18 reach the shot area.

Next, a focus measurement and a scanning exposure according to the first embodiment of the present invention are described. Although the details are described later, in the first embodiment, the measurement accuracy is not affected by the measurement points 18 even when the measurement points 18 reach the exposure area of the shot area 20 during acceleration of the wafer stage 11. Thus, the wafer stage 11 may be driven at a constant speed when the exposure slit 17 has reached the exposure area of the shot area 20. The wafer stage 11 is accelerated at a position where the wafer stage 11 of related art performs the focus measurement at a constant speed. Accordingly, a driving amount of the wafer stage 11 in the scanning direction (x direction) can be reduced in accordance with a distance between the measurement points 18 and the exposure slit 17.

Figure 4:
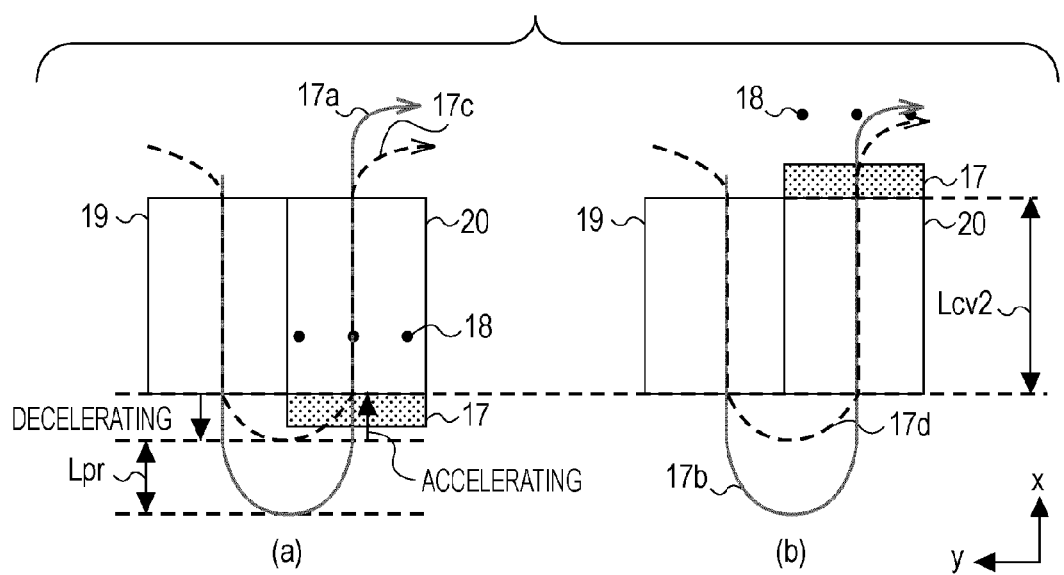
FIG. 4 is an illustration showing a driving locus of a wafer stage during focus control according to the first embodiment of the present invention.

As shown in part (a) of FIG. 4, the position where the constant-speed driving of the wafer stage 11 is started is a position where the exposure slit 17 reaches an end of the shot area 20. Herein, the exposure slit 17 of related art is driven in a driving locus 17a, whereas the exposure slit 17 according to the first embodiment is driven in a driving locus 17c. As shown in part (b) of FIG. 4, a constant speed section Lcv2 of the wafer stage 11 is expressed as Lcv2=Lcv1−Lpr. Herein, the exposure slit 17 of related art is driven in a driving locus 17b, whereas the exposure slit 17 according to the first embodiment is driven in a driving locus 17d. A distance to an acceleration start position for a next exposure of the wafer stage 11 is also reduced by Lpr, and hence, a driving amount of the wafer stage 11 from the end of the exposure to the end of the deceleration is also reduced by an equivalent amount. Accordingly, a driving amount of the wafer stage 11 is reduced by 2Lpr by a single shot. If an exposure of a target shot is performed in a manner similar to a method of related art, a time is not reduced at this moment. Also, after a second shot as a final shot, the wafer stage 11 need not be moved to a next acceleration position, and hence, a time is not reduced.

Accordingly, an exposure time for a single wafer according to the first embodiment can be reduced as follows:

$$2Lpr(n-1)/v \text{ (sec)}$$

where v is a scanning speed and n is the number of shots for a single wafer.

Next, a system for switching between validation and invalidation of the focus measurement is described. In the first embodiment, the focus measurement is performed only while the wafer stage 11 is driven at a constant speed, and is not performed during acceleration or deceleration. To determine this, in the exposure apparatus according to the first embodiment, an accelerometer 11a that measures an acceleration of the wafer stage 11 is provided at the wafer stage 11. The main controller 1 determines whether the wafer stage 11 is in the acceleration (or deceleration) section or the constant speed section, on the basis of an output from the accelerometer 11a. In this case, the accelerometer 11a directly measures the acceleration of the wafer stage 11.

The determination criteria of the constant speed driving has an allowable range to be assumed as driving at a constant speed in view of an error and a disturbance of a measurement system. The determination criteria may be changed depending on the accuracy of the focus measurement. Also, a unit configured to calculate an acceleration using a measurement value at the position of the wafer stage 11, or a unit configured to calculate a variation in acceleration using a driving condition of the wafer stage 11 can be used, as a unit configured to determine the acceleration (or deceleration) of the wafer stage 11. FIG. 1 illustrates an acceleration and deceleration measurement system 2 as such a unit. If the accelerometer 11a is used, the acceleration and deceleration measurement system 2 is no longer necessary. The exposure apparatus can be constructed more easily. In either case, the determination is made between the acceleration or deceleration section, and the constant speed section, on the basis of the acceleration of the wafer stage 11. Using this result, the focus measurement is determined whether it is validated or invalidated. In particular, it is determined that the focus measurement is validated in the constant speed section, whereas it is determined that the focus measurement is invalidated in the acceleration section or the deceleration section.

Next, a method for determining the position of the surface of the wafer 12 in a case where the focus measurement is invalidated is described. In the first embodiment, the wafer stage 11 is accelerated until the exposure slit 17 reaches the end of the shot area 20. At this time, since the measurement points 18 are already located at positions in the shot area 20, the focus measurement is invalidated during the movement from the end of the shot area 20 to the current positions. Thus, a valid focus measurement result does not exist for this portion. At the start of the exposure, the position of the surface of the wafer 12 cannot be determined. Therefore, to determine the position of the surface of the wafer 12 at the start of the exposure while the focus measurement is invalidated, a unit configured to refer the focus measurement result of a peripheral shot area on the wafer 12 is provided in the first embodiment.

For example, a shot area to be exposed is identified as a target shot area, and an exposed shot area adjacent to the target shot area is identified as an exposed shot area. Using the focus measurement result at the measurement points in the exposed shot area corresponding to the measurement points in the target shot area, the exposure is performed while the position of the surface of the wafer 12 in the target shot area is controlled. The measurement points 18 for the focus measurement of the first embodiment are arranged at an equivalent interval along the moving direction (x direction) of the exposure slit 17 in the shot area. This arrangement is common to all shot areas on the wafer 12. The stage position control system 3 drives the wafer stage 11 so that the position of the surface of the wafer 12 is aligned with the best focus position of the projection optical system 16, by using the focus measurement result of the measurement points in the exposed shot area, for the measurement points located in the acceleration section, in which the focus measurement is invalidated. The measurement result of the exposed shot area has been obtained by the focus measurement system through the previous exposure.

Figure 5:
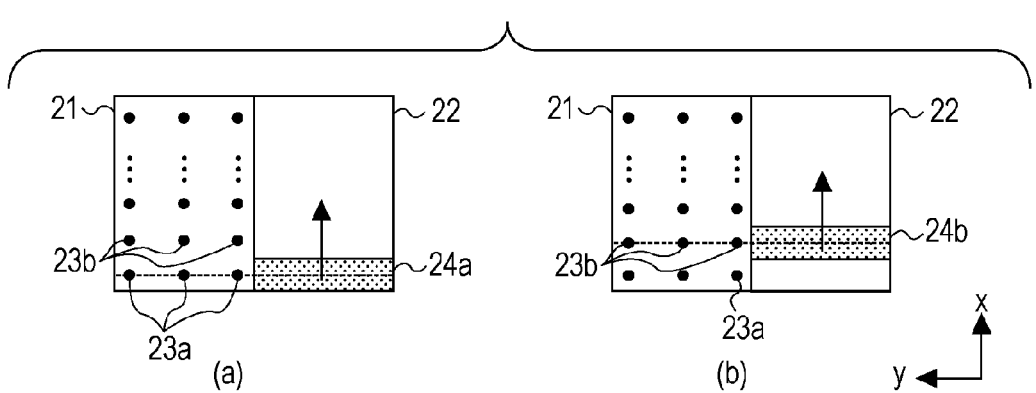
FIG. 5 is an explanatory illustration showing a relationship between an exposure slit in a target shot area and focus measurement points in an exposed shot area adjacent to the target shot area according to the first embodiment of the present invention.

The above-mentioned state is described with reference to FIG. 5. A shot area 22 is a target shot area which is to be exposed. A shot area 21 is an exposed shot area which has been previously exposed. The measurement results of measurement points 23a and 23b in the shot area 21 are stored in the stage position control system 3 even after the exposure of the shot area 21 is completed. For example, in an area 24a in part (a) of FIG. 5, the surface of the wafer 12 is aligned with the best focus position of the projection optical system 16 by using the focus measurement result of the measurement points 23a in the shot area 21. The control of the focus in an area 24b in part (b) of FIG. 5 uses the measurement result of the measurement points 23b.

The adjacent shot areas have similar surface shapes, and hence, one of the focus measurement results can be used for the other. The values measured at the measurement points 23a and 23b are used as the position of the surface in the shot area 22 which is to be exposed, thereby reducing defocusing in an area in which the focus measurement is invalidated. When the exposed adjacent shot area is to be selected, a shot to be selected may be changed in accordance with the position in the optical-axis direction and the inclination with respect to a direction perpendicular to the optical axis, which are the measurement values to be used.

It is noted that when a shot area of a wafer is exposed for the first time, a focus measurement result of an adjacent shot area does not exist. In such a case, constant speed driving of the wafer stage 11 may be started when the focus measurement points reach the exposure area, and the focus measurement may be performed, in a manner similar to a configuration of related art. When an exposed shot area adjacent to a target shot area does not exist, such as when an arrangement of shot areas is changed, or when shot areas are separately arranged, the above-mentioned method may be employed.

FIG. 6 shows a flowchart of the system. First, the exposure is started in step S101. Next, in step S102, it is determined whether a shot area to be exposed is a shot area to be exposed for the first time (first shot). If NO in step S102, or if it is the first shot, since a focus measurement result of an adjacent shot area does not exist, a focus measurement is validated (step S107). If the procedure goes on to step S107, an exposure is performed by using a focus measurement result in step S109. Next, it is determined in step S110 whether the exposure is complete or not. If YES in step S110, the process is completed. If NO, then the process returns to step S102.

In step S103, it is determined whether an exposed shot area which has been exposed previously and which is adjacent to the current shot area exists. If NO in step S103, the focus measurement is validated in a manner similar to step S102. Then, in step S104, an acceleration of the wafer stage 11 is measured, and in step S105, a determination is made upon the result. If it is determined that it is not an accelerating state, the procedure goes on to step S107, in which a focus measurement is performed. If it is determined that the state is the accelerating state in step S105, the procedure goes on to step S106, in which the focus measurement is invalidated. The wafer stage 11 is controlled by using a measurement value of the adjacent exposed shot area (step S108). Then, in step S110, it is determined whether the exposure of the current shot is completed. If NO in step S110, the procedure returns to step S102, and a similar procedure is repeated. On the other hand, if it is determined that the exposure is completed, the exposure of the current shot is ended, and a movement to a next exposure shot is performed.

Next, a second embodiment of a device manufacturing method using the above-described exposure apparatus is described. A device is manufactured by exposing a substrate (wafer, glass plate, etc.) with a photosensitive material applied, by using the exposure apparatus of the above-described first embodiment; developing the substrate, and performing other typical processes. The device may be a semiconductor integrated circuit element, a liquid crystal display element, or the like.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-144279 filed May 30, 2007, which is hereby incorporated by reference herein in its entirety.

What is claimed is:

1. A scanning exposure apparatus having a projection optical system and configured to perform a scanning exposure that is an exposure of a substrate to a pattern of an original through the projection optical system while scanning of the original and the substrate in a scanning direction across an optical axis of the projection optical system is performed, the apparatus comprising:
    a substrate stage configured to hold the substrate and to be moved;
    a measurement system configured to measure a position of the substrate in a direction of the optical-axis; and
    a controller configured to control a position of the substrate stage in the direction of the optical axis based on the position measured by the measurement system while the scanning is performed,
    wherein the controller is configured to perform an acceleration of the substrate stage in the scanning direction up to a starting position where the scanning exposure of a first shot area on the substrate starts, and in to control, during a period of the acceleration, the position of the substrate stage in the direction of the optical axis based on a position of a measurement point in a second shot area, which has been subjected to the scanning exposure, measured by the measurement system previously with the substrate stage scanned at a constant speed.

2. The apparatus according to claim 1, further comprising an accelerometer configured to measure an acceleration of the substrate stage,
    wherein the controller is configured to determines whether it is in the period of the acceleration, based on an output of the accelerometer.

3. The apparatus according to claim 1, wherein the controller is configured to controls the position of the substrate stage in the direction of the optical axis based on a position of the measurement points in the second shot area, if a measurement point in the first shot area equivalent to the measurement point in the second shot area corresponds to a measurement point to be measured by the measurement system during the period of the acceleration.

4. The apparatus according to claim 1, wherein the second shot area is located adjacent to the first shot area.

5. A method of manufacturing a device, the method comprising:
    exposing a substrate to a pattern using the scanning exposure apparatus defined in claim 1;
    developing the exposed substrate; and
    processing the developed substrate to manufacture the device.

6. The method according to claim 5, wherein the apparatus further comprises an accelerometer configured to measure an acceleration of the substrate stage,
    wherein the controller is configured to determines whether it is in the period of the acceleration based on an output of the accelerometer.

7. The method according to claim 5, wherein the controller is configured to control the position of the substrate stage in the direction of the optical axis based on a position of the measurement points in the second shot area, if a measurement point in the first shot area equivalent to the measurement point of the second shot area corresponds to a measurement point to be measured by the measurement system during the period of the acceleration.

8. The method according to claim 5, wherein the second shot area is located adjacent to the first shot area.

* * * * *